United States Patent [19]

Bench et al.

[11] 4,156,867

[45] May 29, 1979

[54] DATA COMMUNICATION SYSTEM WITH RANDOM AND BURST ERROR PROTECTION AND CORRECTION

[75] Inventors: Stephen M. Bench, Lake Zurich; William R. Dirkes, Mundelein; Manohar A. Joglekar, Elk Grove Village; James C. Secora, Hoffman Estates; Michael A. Stepien, Schaumburg, all of Ill.

[73] Assignee: Motorola, Inc., Schaumburg, Ill.

[21] Appl. No.: 830,531

[22] Filed: Sep. 6, 1977

[51] Int. Cl.² .............................................. G06F 11/12
[52] U.S. Cl. ........................................... 340/146.1 AL
[58] Field of Search ................... 340/146.1, 146.1 AL, 340/146.1 D, 146.1 AG, 146.1 C; 325/163, 41

[56] References Cited

U.S. PATENT DOCUMENTS

| | | | |
|---|---|---|---|
| 3,037,697 | 6/1962 | Kahn | 340/146.1 AL |
| 3,234,364 | 2/1966 | Marko | 340/146.1 AL |
| 3,423,729 | 1/1969 | Heller | 340/146.1 AL |
| 3,560,924 | 2/1971 | McBride | 340/146.1 D |
| 3,753,228 | 8/1973 | Nickolas et al. | 340/146.1 D |
| 3,930,121 | 12/1975 | Mathiesen | 325/163 |

OTHER PUBLICATIONS

Brodd and Donnan, Cyclic Redundancy Check for Variable Bit Code Widths, IBM Technical Disclosure Bulletin, vol. 17, No. 6, Nov. 1974, pp. 1708–1709.

*Primary Examiner*—Charles E. Atkinson
*Attorney, Agent, or Firm*—Rolland R. Hackbart; James W. Gillman

[57] ABSTRACT

A data communication system for use in the control and monitoring of mobile stations, for example, in a bus monitoring system, from a central station over a communication channel carrying both data and voice information. Information is encoded into digital messages having a start code followed by one or more data blocks. The start code identifies the beginning of the data block that follows and enables synchronization of clock circuitry to the received data frequency. The data blocks have N digital words with M binary bits where one word is a parity word and N-1 words are data words. Each of the data words has a data portion and parity portion coded for correction of at least one error. Reliability is enhanced by a data detector which discriminates between data and noise or voice to provide an indication of the presence of data. In transmitting the digital messages, the bits of the N words in each data block are interleaved to provide protection against error bursts.

8 Claims, 12 Drawing Figures

| D1 | D2 | D3 | D4 | P1 | P2 | P3 |
|----|----|----|----|----|----|----|
| D5 | D6 | D7 | D8 | P4 | P5 | P6 |
| D9 | D10 | D11 | D12 | P7 | P8 | P9 |
| D13 | D14 | D15 | D16 | P10 | P11 | P12 |
| D17 | D18 | D19 | D20 | P13 | P14 | P15 |
| D21 | D22 | D23 | D24 | P16 | P17 | P18 |
| VP1 | VP2 | VP3 | VP4 | VP5 | VP6 | VP7 |
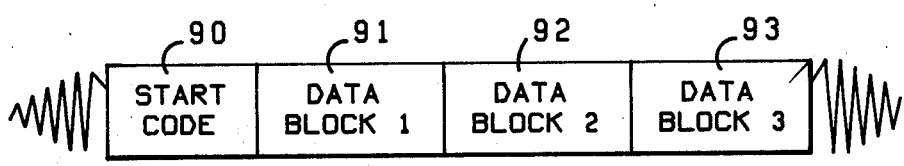
Fig. 3
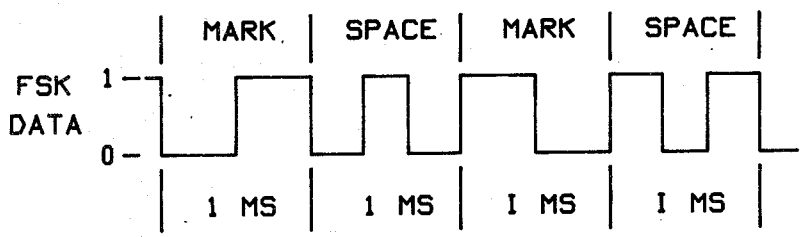
Fig. 2
Fig. 4A
Fig. 4B

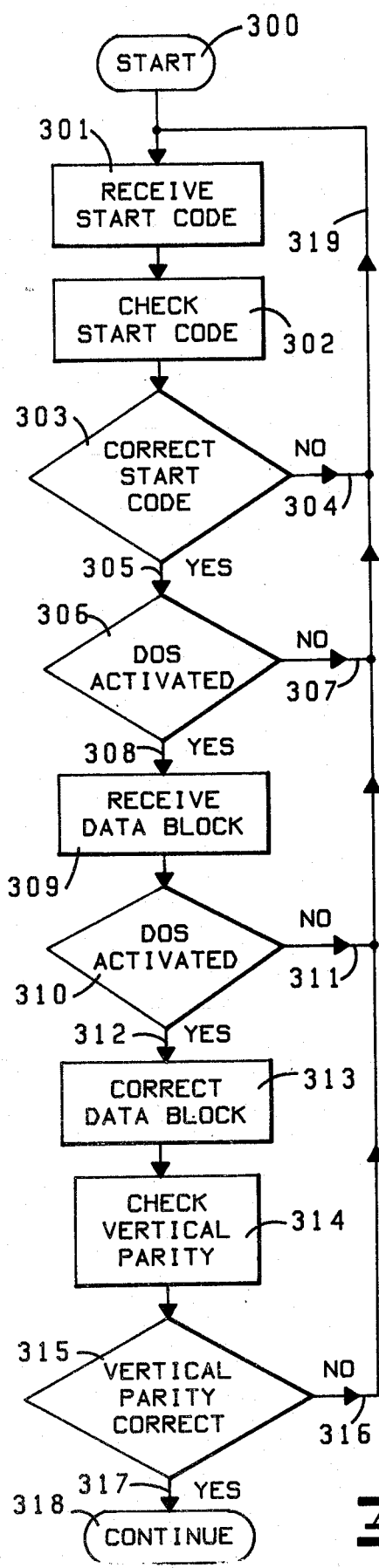
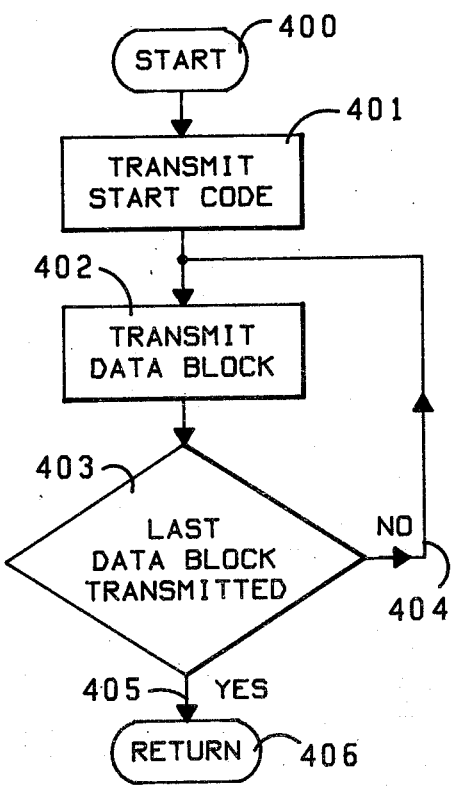
Fig. 9
| DATA | PARITY |
|------|--------|
| 0000 | 000 |
| 0001 | 111 |
| 0010 | 110 |
| 0011 | 001 |
| 0100 | 101 |
| 0101 | 010 |
| 0110 | 011 |
| 0111 | 100 |
| 1000 | 011 |
| 1001 | 100 |
| 1010 | 101 |
| 1011 | 010 |
| 1100 | 110 |
| 1101 | 001 |
| 1110 | 000 |
| 1111 | 111 |
Fig. 10
Fig. 11

DATA COMMUNICATION SYSTEM WITH RANDOM AND BURST ERROR PROTECTION AND CORRECTION

BACKGROUND OF THE INVENTION

1. Field of the Invention

This invention relates to a data communication system, and, more particularly, to an improved method and apparatus for a data communication system utilizing a coded digital signalling system.

2. Description of the Prior Art

In order to expand the capacity of a communication system, one may add more communication channels to the system or increase the amount of information carried on each of the existing communication channels. Since the number of communication channels is limited for most systems, it has been more practical to increase the amount of information carried on each communication channel by various methods, for example, multiplexing and digital techniques. The communication systems using these concentrating techniques must be reliable to insure that the information is not lost. The reliability of communication systems using digital messages may be enhanced by using such techniques as error correcting codes and multiple transmissions of the digital messages. However, prior art communication systems, such as radio communication systems, are still prone to burst errors and have yet to realize optimal usage of error correcting and detecting techniques in a bandwith limited system. This is especially the case with radio communication systems where interference and fading must be accommodated.

For the foregoing and other shortcomings and problems, there has been a long felt need for an improved data communication system.

SUMMARY OF THE INVENTION

Accordingly, it is a general object of the present invention to provide an improved data communication system.

It a further object of the present invention to provide a more reliable data communication system.

It is still a further object of the present invention to provide an improved data communication system that provides random and burst error protection and correction.

It is yet a further object of the present invention to provide an improved data communication system that can recognize the presence of noise or voice to provide additonal protection against the reception of invalid digital messages.

In accordance with the present invention, the aforementioned problems and shortcomings of the prior art are overcome and the stated and other objects are attained by an improved digital data communication system that includes a central station and a plurality of mobile stations. The system may further include one or more fixed stations for providing relevant information, such as geographical location information, to the mobile stations. Communication channels of the system may carry voice between the operator of the mobile station and the dispatcher at the central station without affecting the reliability of the digital message transmissions.

In accordance with a feature of the present invention, digital messages are transmitted after a start code of a predetermined nature. The digital message is formated into at least one data block having N digital words, each word having M binary bits, where M and N are integer numbers. The start code has a predetermined number of binary bits, for example thirty-two, organized in a highly correlatable pattern for defining the beginning of the first data block of the digital message. The N digital words of a data block include at least one parity word and N−1 data words. Each of the data words has a data portion and a parity portion coded for correction of at least one bit which is in error in the data portion. For example, the parity portion can be coded according to a Hamming code. The parity word has M binary bits which are each derived according to a predetermined format from the group of corresponding bits taken from the N−1 data words. The parity word may be chosen so that it does not include long strings of logical zero or logical one bits. This is beneficial in limiting the low frequency content of the digital message and providing bit transitions to enable synchronization to the data frequency.

Additional features, objects, and advantages of the data communication system in accordance with the present invention will be more clearly apprehended from the following detailed description together with the accompanying drawings.

BRIEF DESCRIPTION OF THE DRAWINGS

FIG. 2 illustrates a typical transmission of data having a start code followed by three data blocks.

FIG. 3 illustrates a 7 × 7 digital data block which has 24 data bits, numbered D1 through D24; 18 parity bits, numbered P1 through P18; and 7 vertical parity bits, numbered VP1 through VP7.

FIGS. 4A and 4B illustrate partial waveforms of a digital message where a frequency-shift keying (FSK) waveform is shown in FIG. 4A and the corresponding data waveform is shown in FIG. 4B.

FIG. 9 illustrates logical state assignments which may be utilized for the parity portion of the digital messages.

FIG. 10 illustrates a flow chart of a subprogram of the stored program in the modem of FIG. 5 for receiving digital messages.

FIG. 11 illustrates a flow chart of a subprogram of the stored program in the modem of FIG. 5 for transmitting digital messages.

DESCRIPTION OF THE PREFERRED EMBODIMENT

Figure 1:
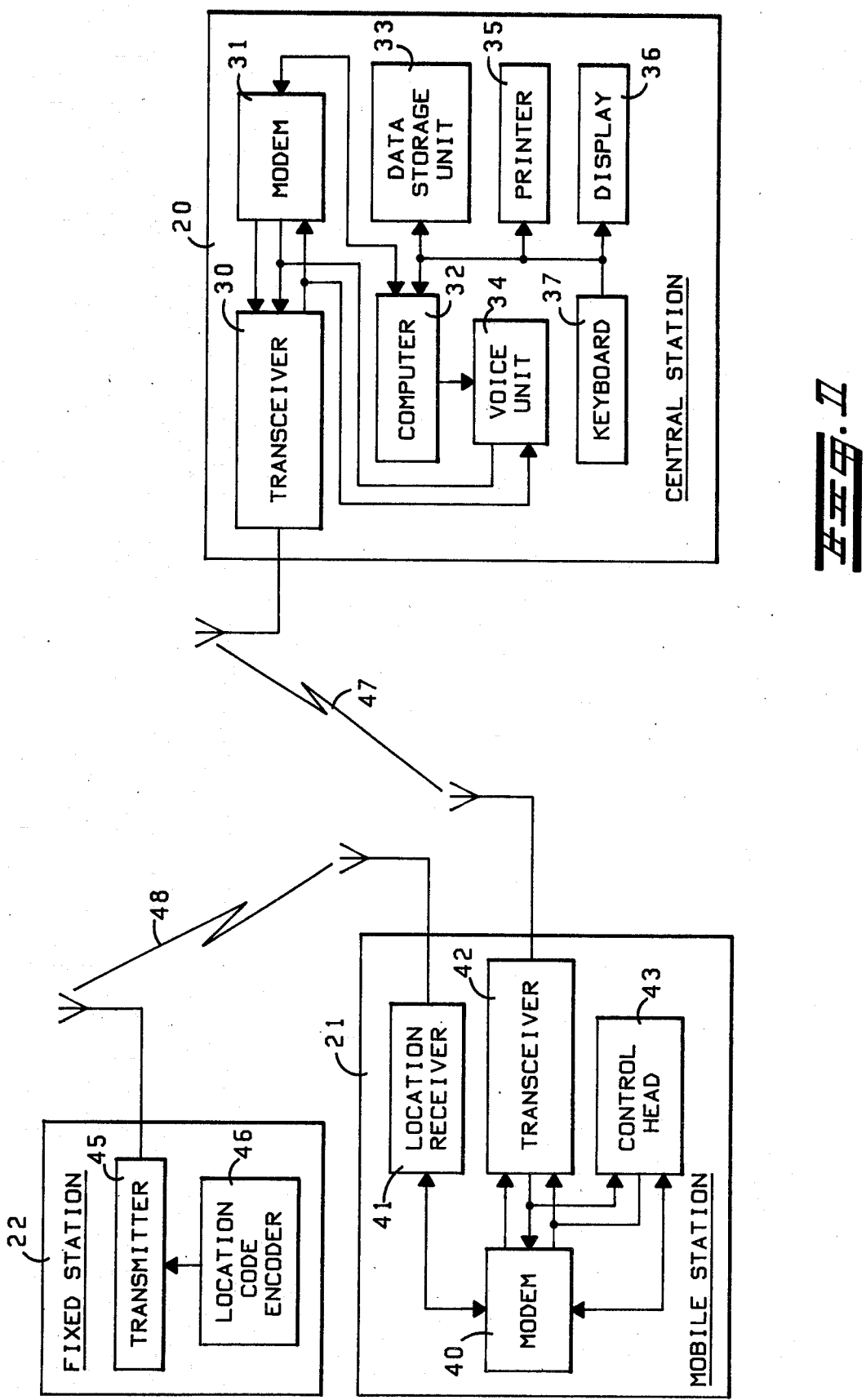
FIG. 1 illustrates a data communication system in accordance with the present invention.

Referring to FIG. 1, a data communication system embodying the present invention is illustrated where information is communicated by digital messages between a central station 20, a mobile station 21 and a fixed station 22 over radio channels. The exemplary embodiment is a computer-controlled vehicle monitoring system which is described in U.S. Pat. No. 3,644,883, entitled "Automatic Vehicle Monitoring, Identification, Location, Alarm and Voice Communication System," by W. M. Borman et al. In this system, the central station 20 is a command and control station that is operated by a dispatcher, the mobile station 21 is a bus and the fixed station 22 is a signpost having a predetermined location code. The bus stores the signpost location code when it passes in close proximity to the particular signpost, and relays that information to the command and control station for providing the dispatcher with the approximate location of the bus along its route of travel. The bus also communicates alarm, status and additional information to the command and control station over the communication channel. Voice communications may also take place between the driver of the bus and the dispatcher. Information is communicated between the bus and the command and control station by digital messages, as will be explained hereinafter. Details of the vehicle location system are also described in the Motorola, Inc. instruction manual entitled, "METROCOM Transit Data System and Location System," published by Motorola Service Publications, 1976, Schaumburg, Illinois.

The above referenced vehicle monitoring system communicates digital messages between the central station 20, the mobile station 21, and the fixed station 22 which are coded according to audio frequency-shift keying (AFSK) at a frequency of 500 bits per second (500 baud). The information in the digital message is repeated twice and the repetitions are compared at the receiving station for error detection purposes. However, no error correction or burst error protection is provided.

In FIG. 1, the central station 20 is made up of a radio tranceiver 30, a modem 31, a voice unit 34, and a computer, or microcomputer 32 and its associated peripherals, data storage unit 33, printer 35, display 36 and keyboard 37. A dispatcher enters information by way of the keyboard 37. The entered information is converted to a digital message by the computer 32, coded by the modem 31 and transmitted over a radio channel 47 to the mobile station 21 by the transceiver 30. Both transmitted and received digital messages are visually displayed to the dispatcher in the display 36, which may be any of a number of displays including alphabetic, graphical, or digital displays.

The mobile station 21 includes a modem 40, a transceiver 42, a location receiver 41 and a control head 43. An operator of the mobile station 21 can talk to the dispatcher by means of the control head 43. Digital messages are coded by the modem 40 and transmitted over the radio channel 47 by the transceiver 42 both automatically and in response to operator directives entered into the control head 43. The location receiver 41 receives a predetermined location code from a fixed station 21 over radio channel 48, which is coded by the modem 40 for transmission to the central station 20.

The fixed station 22 includes a radio transmitter 45 and a location-code encoder 46. Fixed stations 22 are located along the route of the mobile station 21 and are each uniquely assigned a predetermined location code for identifying the particular fixed station 22. The fixed station 22 continuously transmits its predetermined location code on a location radio channel 48 which is different from the data radio channel 47. When a mobile station 21 comes in close proximity to the fixed station 22, it receives the predetermined location code from the particular fixed station 22 and relays it to the central station 20 automatically. Thus, the position of the mobile station 21 along its route of travel can be determined by the central station 20.

The improved data communication system of the present invention utilizes a signalling system which enhances the reliability of the aforementioned vehicle monitoring system and other prior art systems. Referring to FIG. 2, the digital message is preceded by a start code 90 after which one or more data blocks 91, 92 and 93 are transmitted. The start code is preferably a correlatable pattern of binary bits that defines the beginning of the first data block 91 and enables synchronization to the data frequency. Start codes 90 having these characteristics are described in a copending application, Ser. No. 830,951, entitled "Method and Apparatus for the Synchronization of Data Bit Streams," by John En, filed on Sept. 6, 1977 and assigned to same assignee as the present application. The start code selected from the above referenced application for use in the data communication system of the present invention is the 32 bit code with the following bit sequence:

00001010101011010010100110011011.

The particular data rate utilized in the data communication system of the present invention may be any practical frequency selected to meet the system requirements and specifications.

The data blocks 91, 92 and 93 are organized into a 7 × 7 block of binary bits, although any practical number of words and binary bits can be utilized to practice the present invention. In FIG. 3, the 7 × 7 data block 80 contains 24 data bits, numbered D1 through D24; 18 parity bits numbered P1 through P18; and 7 parity bits hereinafter designated vertical parity bits, numbered VP1 through VP7.

A digital word is a horizontal group of bits, for example, D1 through D4 and P1 through P3 being the first digital word. Thus, each word consists of a four-bit data portion and a three-bit parity portion. The parity portion is encoded according to a Hamming code for correcting one error in the corresponding data portion of the digital word. The particular parity bits associated with the data portions of the digital words are listed in FIG. 9, where each digital word is at least a Hamming distance of three from the other digital words.

The parity bits of the digital words are selected to satisfy the matrix equation HT = 0, where H is a rectangular 3 × 7 matrix and T is a 1 × 7 column matrix made up of a digital word from the data block, for example the first digital word of the data block 80 in FIG. 3 would be D1, D2, D3, D4, P1, P2, P3. For the H matrix shown below, the following equations result for the first digital word where the + sign indicates modulo 2 addition.

$$\text{For } H = \begin{bmatrix} 0001111 \\ 0110011 \\ 1010101 \end{bmatrix} \text{ and } T = \begin{bmatrix} D1 \\ D2 \\ D3 \\ D4 \\ P1 \\ P2 \\ P3 \end{bmatrix}$$

$$\text{then } HT = 0 = \begin{bmatrix} D4 + P1 + P2 + P3 \\ D2 + D3 + P2 + P3 \\ D1 + D3 + P1 + P3 \end{bmatrix}$$

If $HT \neq 0$, then a single bit error is assumed to be present and an error correction algorithm may be performed to correct the erroneous bit.

The matrix organization of the data words is readily adapted to processing by a computer or microcomputer. In the data communication system of the present invention, the receiving and transmitting of the digital messages is performed by a microcomputer having a stored program, as will be explained hereinafter.

The bits of the vertical parity word, which are VP1-VP7 (see FIG. 3), are each derived from the group of six bits in its respective column, for example, VP1 is derived from D1, D5, D9, D13, D17 and D21. The vertical parity bits are derived according to a predetermined format such that none of the columns of bits contain all zeros or all ones. For instance, the vertical parity bit can be selected to be a logical one when all other bits in its respective column are logical zeros, and for all other conditions the vertical parity bit is a logical zero. By selecting the vertical parity bits in this manner, the low frequency content of the transmitted data block is reduced, which allows a corresponding reduction in the bandwith of the modem which decreases low frequency noise interference. In addition, the vertical parity bits enable the detection of a double error in at least one of the digital words. The vertical parity bits obtained in the aforementioned manner forms a parity word for the system.

The digital message, transmitted over the communication channel as shown in FIG. 2, is interleaved during transmission to provide burst error protection. Interleaving of the digital message is accomplished by transmitting the columns of binary bits (see FIG. 3) sequentially, instead of transmitting one entire digital word after another. For example, the data block 80 of FIG. 3 would be transmitted in the following sequence; D1, D5, D9, D13, D17, D21, VP1, D2, D6, etc. Interleaving the bits of the digital message results in a maximum fade margin of 7 consecutive erroneous bits. If 7 consecutive bits are in error, then each data word has at most one bit in error which is correctable by use of the Hamming code.

The digital messages are transmitted over the communication channel by means of coherent audio frequency-shift keying. Coherent operation is characterized by transmission of audio tones which are rationally related to each other, with transmission of each bit initiated at a constant and defined phase relationship. Further, the digital messages are transmitted by means of minimum shift keying (MSK). Minimum shift keying operation is characterized by the audio tone for the logical one state being equal to the data frequency and the audio tone representing the logical zero state being equal to 1½ times the data frequency. Each data bit starts and ends on a zero crossing of the respective tones. In the preferred embodiment, the tones selected are 1000 Hz for a mark and 1500 Hz for a space. A mark corresponds to a data bit having a logical one state and a space corresponds to a data bit having a logical zero state. Referring to FIGS. 4a and 4b, a portion of a digital message is shown where FIG. 4a is a waveform of the MSK data and FIG. 4b is a waveform of the demodulated data.

By using MSK with tones of 1000 Hz and 1500 Hz, the spectral energy is contained substantially within the band of frequencies from 800 Hz to 1700 Hz. Such a bandwith is compatible with data communications systems operating over radio communication channels or telephone wire lines. In the preferred embodiment, the frequency of the data which is referred to as 1000 baud, in actuality, is 1075.28 baud which was selected as close as possible to 1000 baud while still being compatible with the frequency of operation of the microcomputer in the modem.

Figure 5:
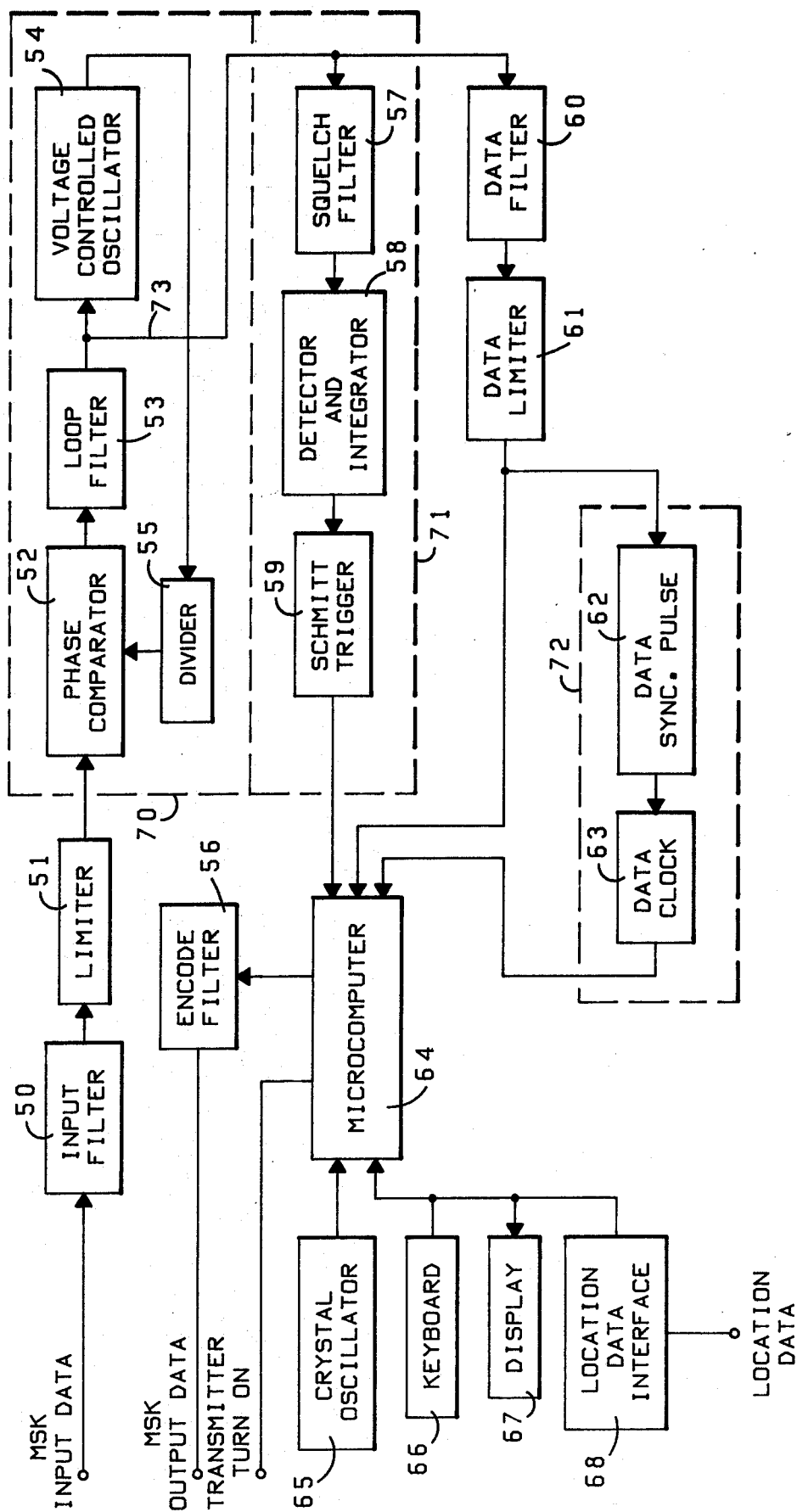
FIG. 5 illustrates a block diagram of a modem for the data communication system of the present invention.
Figure 6:
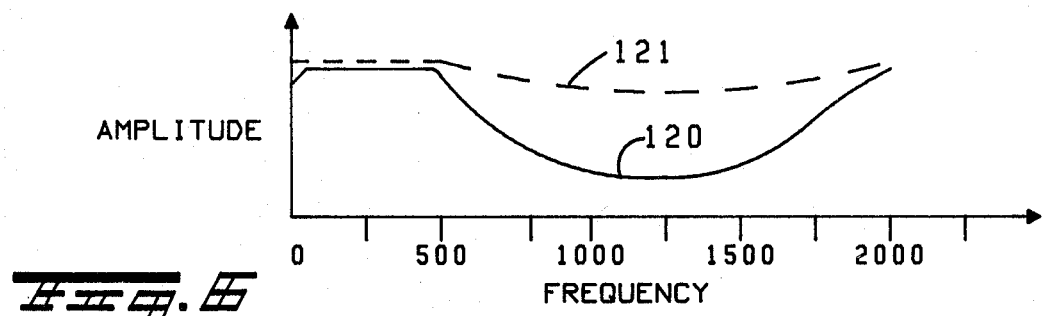
FIG. 6 illustrates a graph of the error voltage resulting from data and noise inputs to the phase locked loop for the modem of FIG. 5.

Referring to FIG. 5, a block diagram illustrates more clearly an embodiment of a modem for the data communication system of the present invention. The MSK input data is first connected to the input filter shown 50. The purpose of this filter is to provide some pre-filtering action to limit the input bandwith to only that occupied by the MSK input data and to reject noise falling outside this band. For example, it may be comprised of four poles of high frequency at 1800 Hz and two poles of low frequency roll off, whereby providing an input filter which is generally a bandpass filter occupying the band 800 Hz to 1700 Hz. The output of the input filter 50 is then amplified and limited by the limiter 51. The purpose of the limiter 51 is to provide a square wave signal to the phase comparator 52 of the phase locked loop 70. Therefore, the MSK input data is translated into zero-crossing information by the limiter 51, which is then processed by the phase locked loop 70.

The phase locked loop 70 includes a phase comparator 52, a loop filter 53, a voltage controlled oscillator (VCO) 54 and a divider 55. The phase comparator 52 compares the incoming phase of the limited MSK input data to that of the VCO 54 through the divider 55. It then provides an output voltage to the loop filter 53 indicating that the frequency of the VCO 54 is either too high or too low for correcting the frequency of the voltage control oscillator.

The loop filter 53 is tailored to reject noise which may be introduced by either the phase locked loop 70 itself or the MSK input data through a noisy signal. The bandwidth of the loop filter 53 is therefore controlled to be only that necessary for the data, which is approximately 500 Hz for MSK input data at 1000 baud. The loop filter 53 not only limits the bandwidth in the phase locked loop 70, but also maintains the stability of the phase locked loop 70. The error voltage 73 from the loop filter 53 is then fed into the VCO 54. The output of the VCO 54 is approximately sixteen times the frequency of the MSK input data and is fed into a divider 55 for dividing the VCO by sixteen. Operating the VCO 54 at sixteen times the frequency of the MSK input data provides better protection against noise and allows improved operation of the phase locked loop 70.

The error voltage 73 from the loop filter 53 contains the recovered data together with high frequency components. The error voltage 73 is coupled to the data-operated-squelch circuitry 71 and the data filter 60. The data filter 60 is a low pass filter for removing the input data from the error voltage 73, where the data is contained substantially within the frequency band from 0 Hz to 500 Hz. The data filter 60 is optimized to closely match the characteristics of input data carried on the error voltage 73.

The data limiter 61 then provides mark and space (see FIGS. 4A and 4B) information by a conventional bit slicing process. If the input data is more generally of mark frequency, the output of the data limiter 61 is a logical one. If the input data is generally more of a space frequecy, the output of the data limiter 61 is a logical zero. The output of the data limiter 61 is the recovered input data which is coupled to the data clock circuitry 72 and the microcomputer 64. The data clock circuitry 72 utilizes the transitions of the recovered input data from the data limiter 61 for synchronizing to the input data frequency. The data sync pulse 62 provides a sync pulse for each transition of the recovered input data.

Figure 8:
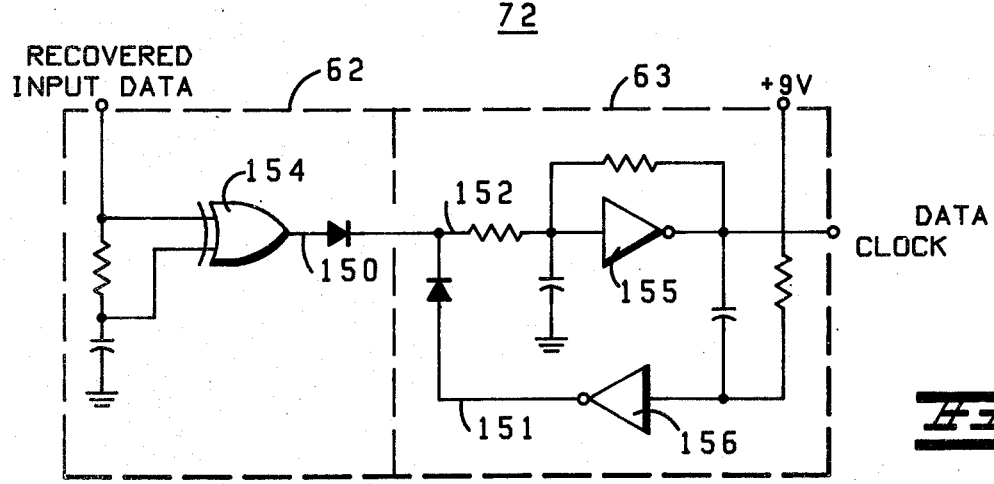
FIG. 8 illustrates an embodiment of the data clock circuitry for the modem of FIG. 5.

The sync pulses are applied to the data clock 63 for phase synchronizing the data clock 63 to the data frequency. In the absence of sync pulses, the data clock 63 free runs at the data frequency, 1000 baud in the exemplary embodiment. The output of the data clock 63 is approximately a 1000 Hz square wave with fifty percent duty cycle and is applied to the microcomputer 64. An ememplary embodiment of the blocks 62 and 63 of the data clock circuitry 72 is illustrated in detail in FIG. 8.

Figure 7:
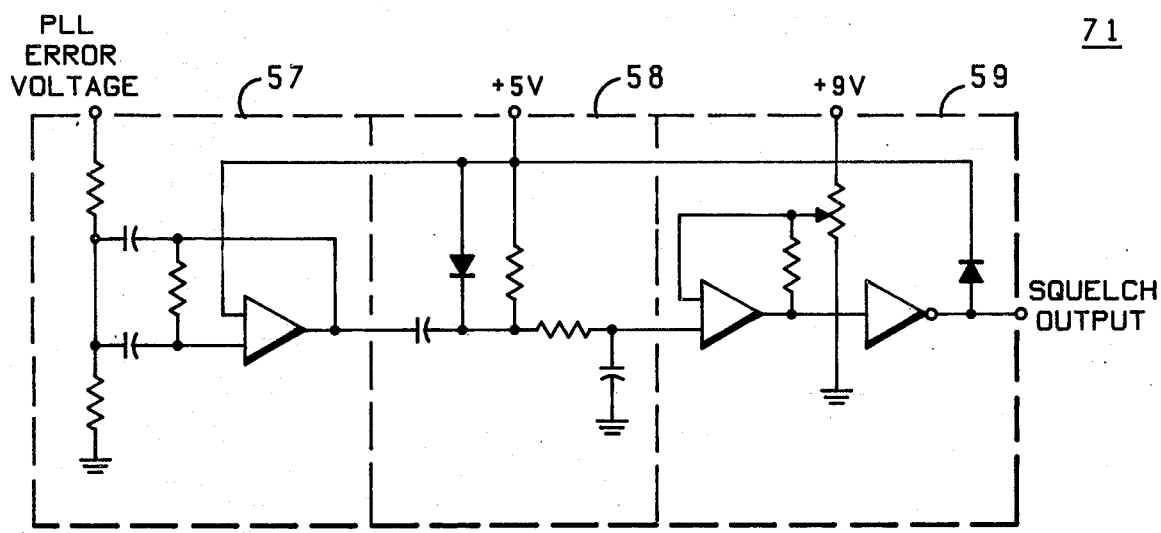
FIG. 7 illustrates an embodiment of the data-operated-squelch circuitry for the modem of FIG. 5.

The data-operated-squelch (DOS) circuitry 71 includes a squelch filter 57, a detector and integrator 58 and a Schmitt trigger 59. The output of the Schmitt trigger is a logical zero when data has been detected and is applied to the microcomputer 64. The data-operated-squelch circuitry 71, accurately discriminates data from noise, voice, or music. An exemplary embodiment of the blocks 57, 58 and 59 of the DOS circuitry 71 is illustrated in detail in FIG. 7.

A computer system, which controls the generation of the modem, includes a microcomputer 64, a crystal oscillator 65, a keyboard 66, a display 67, and a location data interface 68. The computer system can utilize any of a number of commercially available microcomputers or computers, for example, the Motorola MC6801 or the combination of the MC6802 and MC6846. The crystal oscillator 65 provides the operating frequency for the microcomputer 64. The microcomputer 64 receives operator information from the keyboard 66 and location data from the location data interface 68 and provides information to an operator in the display 67. The keyboard 66, display 67 and location data interface 68 (see aforementioned U.S. Pat. No. 3,644,883) are interconnected with the microcomputer 64 via address and data bus lines in a conventional manner. Furthermore, all interface connections to the microcomputer 64 can be readily accomplished by one skilled in the art by conventional techniques. For example, where the microcomputer 64 is the MC6801, one may refer to the published specification for the MC6801 to determine specific interconnections to the MC6801 ports. When using an MC6801, the keyboard 66, display 67 and location data interface 68 may be connected to parallel address and data ports, while the encode filter 56, DOS circuitry 71, data limiter 61 and clock circuitry 72 may be connected to single-line input/output ports.

For receiving digital messages, the microcomputer 64 assembles and de-interleaves the recovered input data from the data limiter 61 as defined by the recovered data frequency from the data clock 63. If an indication that data is present is not received from the data-operated-squelch circuitry 71, the received digital message will be ignored. Also, if the recovered input data has more than one error in at least one word, the received digital message is invalid.

For transmission of information the microcomputer 64 arranges the information into a digital message having a start code followed by requisite data blocks and applies the digital message in MSK format to the encode filter 56. The encode filter 56 takes the digital waveform from the microcomputer 64 and provides the sinusoidal MSK output data for transmission on the communication channel.

FIGS. 10 and 11 illustrate flow charts of sub-programs of the modem stored program for receiving and transmitting digital messages, respectively. The flow charts of FIGS. 10 and 11 represent the logical sequences of operations that must be performed in order to receive and transmit digital messages, respectively. The flow charts of FIGS. 10 and 11 are explicit descriptions of the microcomputer algorithms necessary to achieve the desired function. By referring to the flow charts of FIGS. 10 and 11, one of ordinary skill in the programming art may code the appropriate combination of instructions for a particular microcomputer to satisfy the operations called for in each block of the respective flow charts. The coding of the flow charts of FIGS. 10 and 11 may be accomplished in any suitable manner using the instructions of the particular microcomputer, for example, such as the instructions of the MC6801. The operations and processes specified in each block of the flow charts of FIGS. 10 and 11 are further supplemented in the foregoing description. In FIG. 10, the flow chart of the subprogram for receiving a digital message begins at START terminal 300. Preceding to box 301, the start code is received serially bit by bit and stored in the memory of the microcomputer. Next, when the entire start code has been received, the start code is checked and correlated with the predetermined start code stored in the memory of the microcomputer, as shown in box 302. In the preferred embodiment, the start code can have as many as six bits out of 32 bits which are in error and still recognize the received start code. Preceding to decision box 303, if the start code is correctly received, the YES branch 305 is taken to decision box 306, otherwise the NO branch 304 is taken to return along path 319 to box 301.

The reception of the start code has provided sufficient time for the data-operated-squelch circuitry to detect the presence of valid data. In decision box 306, if the data-operated-squelch circuitry has been activated, the YES branch 308 is taken to box 309, otherwise the NO branch 307 is taken to return along path 319 to box 301.

Next, the data blocks following the start code are received and stored into the memory of the microcomputer, as shown in box 309. Depending on the configuration of the data communication system, one or more data blocks are received before proceeding to the decision box 310. Next, at decision box 310, if the data-operated-squelch circuitry is still activated, the YES path 312 is taken to box 313, otherwise a NO path 311 is taken to return along path 319 to box 301.

According to box 313, the received data blocks are corrected using the parity portion of each data word to correct the respective data portion. Finally, a vertical parity word is generated for each corrected data block, as shown in box 314. Then in decision box 315, the generated vertical parity word is compared with the received vertical parity word and if they are identical, YES branch 317 is taken to terminal 318, otherwise the NO branch 316 is taken to return along path 319 to box 301. A valid digital message has been received when reaching the CONTINUE terminal 318 which is the end of this subprogram.

In FIG. 11, a flow chart of a subprogram for transmitting a digital message begins at the start terminal 400 and proceeds to box 401. First, the start code which is stored in a predetermined location in the microcomputer memory is transmitted serially bit by bit with an MSK bit pattern. Next in box 402, the selected data block is transmitted serially bit by bit an MSK format also. Proceeding to decision box 403, if the last data block has been transmitted, YES branch 405 is taken to RETURN terminal 406, otherwise NO branch 404 is taken to return to box 402. RETURN terminal 406, the end of this subprogram, is reached when all of the data blocks for a particular digital message have been transmitted.

Several features of the data communications system in accordance with the present invention have a wider applicability which can be advantageously utilized in any communication system. For example, the use of MSK signalling has provided optimum bit error performance with a minimum of frequency bandwith. The digital messages can be readily expanded to provide any number of data blocks. System reliability has been provided by use of the error correcting code, interleaving the data bits during transmission, and the data-operated-squelch circuitry 71 for discriminating between data and noise or voice. The data-operated-squelch circuitry 71 permits the communication channel to be used for both data and voice without degradation in system reliability. Data clock circuitry 72 has been provided that adaptively sychronizes to the data frequency and operates at the data frequency when synchronizing information is not available. These and other features described hereinabove can be advantageously utilized in any system for reliably communicating information.

The foregoing embodiments have been intended as illustrations of the principles of the present invention. Accordingly, other modifications, uses and embodiments can be devised by those skilled in the art without departing from the spirit and scope of the principles of the present invention.

What is claimed is:

1. In a data communication system having a central station and a plurality of mobile stations, an improved method for reliably transmitting digital information via a communication channel between the central station and the mobile stations, and between the mobile stations and the central station, said method comprising the steps of:
   (a) arranging the digital information into at least one data block having N digital words, each digital word having M binary bits, where N and M are predetermined integer numbers;
   (b) predeterminedly interleaving the bits of the data block such that each group of N consecutive bits includes at most one bit from each digital word of the data block;
   (c) serially transmitting a burst-error tolerant start code having a predetermined number of bits organized in a predetermined pattern that is substantially correlatable when at most N bits of the start code are in error; and
   (d) serially transmitting the interleaved data block after the start code.

2. The method according to claim 1 wherein said arranging step comprises:
   arranging the digital information into at least one data block having N−1 digital words, each word having M binary bits, where N and M are predetermined integer numbers;
   generating for each digital word a corresponding horizontal parity portion having K binary bits coded for correcting at least one bit error in the corresponding digital word, where K is a predetermined integer number;
   appending to each digital word the corresponding horizontal parity portion; and
   generating at least one vertical parity word having M+K binary bits, each bit of the vertical parity word predeterminedly derived from a group of N−1 bits in corresponding bit positions of the N−1 appended digital words.

3. The method according to claim 2, wherein said vertical parity generating step includes the step of providing each bit of the vertical parity word with a predetermined first logical state when all bits of the corresponding group of N−1 bits have a predetermined second logical state, and with a predetermined second logical state when all bits of the corresponding group of N−1 bits do not have a predetermined second logical state.

4. The method according to claim 1, wherein the start code transmitting step transmits a thirty-two bit start code having the following bit pattern:

00001010101011010010100110011011.

5. The method according to claim 3, wherein said horizontal parity generating step generates the bits of the horizontal parity portion in accordance with a predetermined Hamming code.

6. In a data communication system having a central station and a plurality of mobile stations, an improved method for reliably transmitting digital information via a communication channel between the central station and mobile stations, and between the mobile stations and the central station, said method comprising the steps of:
   (a) forming a plurality of data blocks, each data block formed according to the steps of:
      (i) arranging the digital information into N−1 digital words each having M binary bits, where N and M are predetermined integer numbers;
      (ii) generating for each digital word a corresponding horizontal parity portion having K binary bits coded for correcting at least one bit error in the corresponding digital word, where K is a predetermined integer number;
      (iii) appending to each digital word the corresponding horizontal parity portion; and
      (iv) generating at least one vertical parity word having M+K binary bits, each bit of the vertical parity word predeterminedly derived from a group of N−1 bits in corresponding bit positions of the N−1 appended digital;
   (b) predeterminedly interleaving the bits of each data block such that each group of N consecutive bits includes at most one bit from each appended data word and at most one bit from the vertical parity word;
   (c) serially transmitting a burst-error tolerant start code having a predetermined number of bits organized in a predetermined pattern that is substantially correlatable when at most N bits of the start code are in error; and
   (d) serially transmitting in succession the interleaved data blocks after the start code.

7. The method according to claim 6, wherein said vertical parity generating step includes the step of providing each bit of the vertical parity word with a predetermined first logical state when all bits of the corresponding group of N−1 bits have a predetermined second logical state, and with a predetermined second logical state when all bits of the corresponding group of N−1 bits do not have a predetermined second logical state.

8. In a data communication system having a central station and a plurality of mobile stations, an improved method for receiving digital information transmitted via a communication channel between the central station and the mobile stations, and between the mobile stations and the central station, the digital information preceded by a burst-error tolerant start code and organized into a plurality of data blocks having predeterminedly interleaved bits, the start code having a predetermined number of bits organized into a predetermined bit pattern that is substantially correlatable when at most N bits are in error, each data block including N−1 digital words having horizontal parity portions appended thereto, and at least one vertical parity word, the horizontal parity portion of each digital word coded for correction of at least one bit error introduced during transmission, the bits of the vertical parity word predeterminedly derived from a group of N−1 bits in corresponding bit positions of the N−1 digital words of the respective data block, said method comprising the steps of:

receiving bit by bit the digital information;

sequentially storing the received bits;

continuously comparing the predetermined bit pattern of the start code against a corresponding number of stored bits last received, and providing a start-code detect signal when the group of last received bits differs from the predetermined bit pattern of the start code in no more than N bit positions;

de-interleaving in response to the start-code detect signal the stored bits of each data block;

correcting the de-interleaved bits corresponding to each digital word of each data block in accordance with the bits corresponding to the horizontal parity portion of the respective digital word;

regenerating a vertical parity word from the corrected digital words for each data block;

comparing the regenerated vertical parity word with the stored bits corresponding to the vertical parity word for each data block and providing a data-block incorrect signal when the regenerated vertical parity word and the stored bits corresponding to the vertical parity word are not substantially the same;

rejecting in response to the data-block incorrect signal the stored bits for the corresponding data block;

continuously monitoring the received bits for the absence of the transmitted digital information and providing a data squelch signal when the transmitted digital information is absent for at least a predetermined interval; and rejecting the stored bits for each data block in response to the data squelch signal.

* * * * *